United States Patent
Katou et al.

(10) Patent No.: US 11,616,494 B1
(45) Date of Patent: Mar. 28, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Satoshi Katou, Yokohama Kanagawa (JP); Hideo Arimoto, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/591,368

(22) Filed: Feb. 2, 2022

(30) Foreign Application Priority Data

Sep. 15, 2021 (JP) .............................. JP2021-150593
Dec. 24, 2021 (JP) .............................. JP2021-211402

(51) Int. Cl.
*H03K 3/012* (2006.01)
*H03K 17/687* (2006.01)
*H03K 5/01* (2006.01)
*H03K 5/00* (2006.01)

(52) U.S. Cl.
CPC .............. *H03K 3/012* (2013.01); *H03K 5/01* (2013.01); *H03K 17/6871* (2013.01); *H03K 2005/00078* (2013.01)

(58) Field of Classification Search
CPC ...... H03K 3/012; H03K 5/01; H03K 17/6871; H03K 2005/00078
See application file for complete search history.

(56) References Cited

U.S. PATENT DOCUMENTS

| | | | |
|---|---|---|---|
| 6,653,697 B2 | 11/2003 | Hidaka et al. | |
| 2010/0225378 A1 | 9/2010 | Nakatsuka et al. | |
| 2012/0274387 A1* | 11/2012 | Adamski | H03K 17/693 327/437 |
| 2018/0083609 A1* | 3/2018 | Kunishi | H03K 17/005 |
| 2019/0245574 A1* | 8/2019 | Jo | H04B 1/48 |
| 2019/0265770 A1* | 8/2019 | Kurokawa | G06F 1/3243 |

FOREIGN PATENT DOCUMENTS

| | | |
|---|---|---|
| JP | 3616343 B2 | 2/2005 |
| JP | 2007-019590 A | 1/2007 |
| JP | 2010-233207 A | 10/2010 |

* cited by examiner

*Primary Examiner* — Metasebia T Retebo
(74) *Attorney, Agent, or Firm* — Kim & Stewart LLP

(57) ABSTRACT

First and second switches are connected in series between first and second terminals. A third switch is provided between a first node between the first terminal and the first switch, and a first resistive-element. A fourth switch is provided between a second node between the first and second switches, and the reference power-source. A controller switches the first to fourth switches between conduction and non-conduction states. First, third, fifth, and seventh delay-circuits are provided between the first to fourth switches and the controller and delay first, second, third, fourth control signals for switching the first to fourth switches from a conduction state to a non-conduction state, respectively. Second, fourth, sixth, and eighth delay-circuits are provided between the first to fourth switches and the controller and delay the first, second, third, fourth control signals for switching the first to fourth switches to a non-conduction state to a conduction state, respectively.

16 Claims, 15 Drawing Sheets

DLY1a~DLY5b

SEMICONDUCTOR DEVICE

CROSS REFERENCE TO RELATED APPLICATIONS

This application is based upon and claims the benefit of priority from the prior Japanese Patent Applications No. 2021-150593, filed on Sep. 15, 2021 and No. 2021-211402, filed on Dec. 24, 2021, the entire contents of which are incorporated herein by reference.

FIELD

The embodiments of the present invention relate to a semiconductor device.

BACKGROUND

A high-frequency semiconductor switch circuit is used to switch signal paths with respect to each frequency band of a radio signal in radio communication terminals such as a smartphone. A switch circuit of the high-frequency semiconductor switch is generally constituted of an FET (Field Effect Transistor) and switches the signal paths by conduction/non-conduction (ON/OFF) of the FET.

However, the high-frequency semiconductor switch circuit has a problem that VSWR (Voltage Standing Wave Ratio) becomes high as in an open circuit or a short circuit during switch changing in some operation timings of the FET at the time of switching the FET between ON and OFF, and this deteriorates the power efficiency.

BRIEF DESCRIPTION OF THE DRAWINGS

FIG. 1013 is another conceptual diagram illustrating a manner of transition of the semiconductor switch circuit from a non-conduction state to a conduction state;

DETAILED DESCRIPTION

Figure 1:
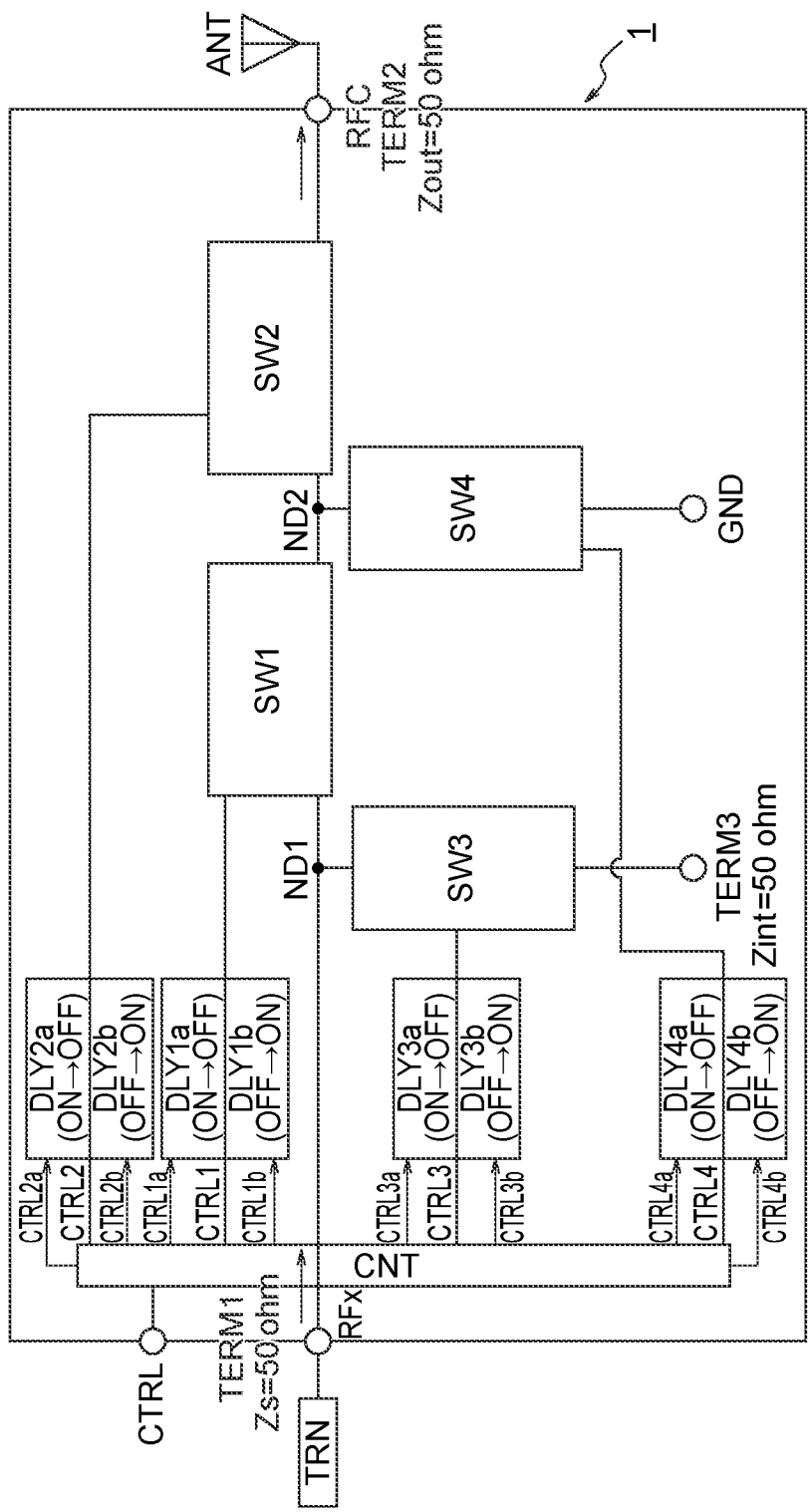
FIG. 1 is a block diagram illustrating a configuration example of a semiconductor switch circuit according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a first terminal configured to receive a high-frequency signal and a second terminal configured to output the high-frequency signal. First and second switch circuits are connected in series between the first terminal and the second terminal. A third switch circuit is provided between a first node between the first terminal and the first switch circuit, and a first resistive element, and is connected to a reference power source via the first resistive element. A fourth switch circuit is connected between a second node between the first switch circuit and the second switch circuit, and the reference power source. A control circuit is configured to switch the first to fourth switch circuits between a conduction state and a non-conduction state. A first delay circuit is provided between the first switch circuit and the control circuit. The first delay circuit is configured to delay a first control signal transmitted from the control circuit to the first switch circuit, when the first control signal switches the first switch circuit from a conduction state to a non-conduction state. A second delay circuit is provided between the first switch circuit and the control circuit. The second delay circuit is configured to delay the first control signal, when the first control signal switches the first switch circuit from a non-conduction state to a conduction state. A third delay circuit is provided between the second switch circuit and the control circuit. The third delay circuit is configured to delay a second control signal transmitted from the control circuit to the second switch circuit, when the second control signal switches the second switch circuit from a conduction state to a non-conduction state. A fourth delay circuit is provided between the second switch circuit and the control circuit. The fourth delay circuit is configured to delay the second control signal, when the second control signal switches the second switch circuit from a non-conduction state to a conduction state. A fifth delay circuit is provided between the third switch circuit and the control circuit. The fifth delay circuit is configured to delay a third control signal transmitted from the control circuit to the third switch circuit, when the third control signal switches the third switch circuit from a conduction state to a non-conduction state. A sixth delay circuit is provided between the third switch circuit and the control circuit. The sixth delay circuit is configured to delay the third control signal, when the third control signal switches the third switch circuit from a non-conduction state to a conduction state. A seventh delay circuit is provided between the fourth switch circuit and the control circuit. The seventh delay circuit is configured to delay a fourth control signal transmitted from the control circuit to the fourth switch circuit, when the fourth control signal switches the fourth switch circuit from a conduction state to a non-conduction state. An eighth delay circuit is provided between the fourth switch circuit and the control circuit. The eighth delay circuit is configured to delay the fourth control signal, when the fourth control signal switches the fourth switch circuit from a non-conduction state to a conduction state.

First Embodiment

FIG. 1 is a block diagram illustrating a configuration example of a semiconductor switch circuit 1 according to a first embodiment. The semiconductor switch circuit 1 is a semiconductor device used to switch signal paths of a radio signal of a certain frequency band in radio communication terminals such as a smartphone. The semiconductor switch circuit 1 is provided between an antenna ANT for the radio signal and a transmitting/receiving circuit TRN. The transmitting/receiving circuit TRN includes an LNA (Low Noise Amplifier) that amplifies the radio signal transmitted and received, and the like. The semiconductor switch circuit 1 can be configured as one semiconductor chip or may be a semiconductor device constituted of a plurality of semiconductor chips. The transmitting/receiving circuit TRN and/or the antenna ANT can be constituted of the same semiconductor chip as that of the semiconductor switch circuit 1 or may be configured as separate components.

The semiconductor switch circuit 1 includes an input terminal RFx, an output terminal RFC, switch circuits SW1 to SW4, a control circuit CNT, and delay circuits DLY1a to DLY4b.

The input terminal RFx being a first terminal receives a radio signal (a high-frequency signal) as an input from the transmitting/receiving circuit TRN. The output terminal RFC being a second terminal outputs the radio signal input from the input terminal RFx to the antenna ANT via the switch circuits SW1 and SW2. The output terminal RFC outputs the radio signal from the input terminal RFx to the antenna ANT when the switch circuits SW1 and SW2 are in a conduction state (ON). The output terminal RFC does not output the radio signal from the input terminal RFx to the antenna ANT when the switch circuits SW1 and SW2 are in a non-conduction state (OFF). In this case, the switch circuits SW3 and SW4 are brought to the conduction state (ON) and release (shunt) the radio signal to the side of ground GND. At this time, the antenna ANT may transmit other radio signals from other switch circuits (not illustrated).

The characteristic impedance at the input terminal RFx is set to, for example, about 50 ohms. The impedance on a power source side on the side of the input terminal RFx and the impedance on a load side from the output terminal RFC are also, for example, about 50 ohms. Accordingly, the impedance of the semiconductor switch circuit 1 is kept at, for example, about 50 ohms and impedance matching is provided.

The switch circuits SW1 and SW2 being first and second switch circuits are connected in series between the input terminal RFx and the output terminal RFC. The switch circuits SW1 and SW2 pass the radio signal from the input terminal RFx to the output terminal RFC. That is, the switch circuits SW1 and SW2 function as a so-called "through switch". Although not illustrated in the drawings, each of the switch circuits SW1 and SW2 is constituted of one FET (Field Effect Transistor) or a plurality of FETs. When each of the switch circuits SW1 and SW2 is constituted of plural FETs, the FETs are connected in series or in parallel to each other in each of the switch circuits SW1 and SW2. The FETs constituting the switch circuit SW1 are controlled by a control signal CTRL1 from the control circuit CNT to be brought to a conduction state/a non-conduction state (ON/OFF) synchronously (simultaneously). The FETs constituting the switch circuit SW2 are controlled by a control signal CTRL2 from the control circuit CNT to be brought to a conduction state/a non-conduction state (ON/OFF) synchronously (simultaneously).

The switch circuit SW3 being a third switch circuit is connected between a node ND1 and a termination resistor TERM3. The node ND1 is a connecting line between the input terminal RFx and the switch circuit SW1. The termination resistor TERM3 is connected between the switch circuit SW3 and the ground GND. That is, one end of the switch circuit SW3 is connected to the node ND1 and the other end is connected to the ground GND via the termination resistor TERM3. The termination resistor TERM3 is set to, for example, about 50 ohms of impedance as viewed from the switch circuit SW3. Accordingly, the impedance of the termination resistor TERM3 is also matched with the characteristic impedance of the semiconductor switch circuit 1.

The switch circuit SW3 passes the radio signal from the input terminal RFx to the ground GND via the termination resistor TERM3. That is, the switch circuit SW3 functions as a so-called "shunt switch". Although not illustrated in the drawings, the switch circuit SW3 is constituted of one FET or a plurality of FETs. When the switch circuit SW3 is constituted of plural FETs, the FETs are connected in series or in parallel to each other. The FETs constituting the switch circuit SW3 are controlled by a control signal CTRL3 from the control circuit CNT to be brought to a conduction state/a non-conduction state (ON/OFF) synchronously (simultaneously).

The switch circuit SW4 being a fourth switch circuit is connected between a node ND2 and the ground GND. The node ND2 is a connecting line between the switch circuit SW1 and the switch circuit SW2. One end of the switch circuit SW4 is connected to the node ND2 and the other end is connected to the ground GND. The impedance of the semiconductor switch circuit 1 as viewed from the switch circuit SW4 is substantially zero.

The switch circuit SW4 passes the radio signal from the input terminal RFx to the ground GND. That is, the switch circuit SW4 functions as a so-called "shunt switch". Although not illustrated in the drawings, the switch circuit SW4 is constituted of one FET or a plurality of FETs. When the switch circuit SW4 is constituted of plural FETs, the FETs are connected in series or in parallel to each other. The FETs constituting the switch circuit SW4 are controlled by a control signal CTRL4 from the control circuit CNT to be brought to a conduction state/a non-conduction state (ON/OFF) synchronously (simultaneously).

The conductive types of the FETs of the switch circuits SW1 to SW4 are not particularly limited. The following explanations are provided assuming that the switch circuits SW1 to SW4 are constituted of n-type FETs.

The control circuit CNT receives a control signal CTRL from outside and may simultaneously output the control signals CTRL1 to CTRL4 corresponding to the control signal CTRL to the delay circuits DLY1a to DLY4b, respectively. That is, although the control signals CTRL1 to CTRL4 may be simultaneously output from the control circuit CNT to the delay circuits DLY1a to DLY4b, respectively, the delay circuits DLY1a to DLY4b delay the control signals CTRL1 to CTRL4 by the delay times Tdly1 to Tdly4 as shown in figures. The control signals CTRL1 and CTRL2 are signals of a same logic at the time other than switching periods, and the control signals CTRL3 and CTRL4 are signals of a same logic at the time other than the switching periods. Meanwhile, the control signals CTRL1 and CTRL2 and the control signals CTRL3 and CTRL4 are signals of opposite logics (complementary with each other) at the time other than the switching periods. Therefore, when the switch circuits SW1 and SW2 are in a conduction state, the switch circuits SW3 and SW4 are in a non-conduction state and the radio signal passes from the input terminal RFx to the output terminal RFC. Accordingly, the radio signal is transmitted from the antenna ANT. On the other hand, when the switch circuits SW1 and SW2 are in the non-conduction state, the switch circuits SW3 and SW4 are in the conduction state and the radio signal is released (shunted) from the input terminal RFx to the ground GND. At this time, the radio signal is not transmitted from the antenna ANT.

The control signal CTRL is a signal for generating the control signals CTRL1 and CTRL2 and the control signals CTRL3 and CTRL4. For example, when the control signal CTRL is a signal of the same logic as that of the control signals CTRL1 and CTRL2, the control signals CTRL3 and CTRL4 are signals of an inverted logic of the control signal CTRL.

Figure 11:
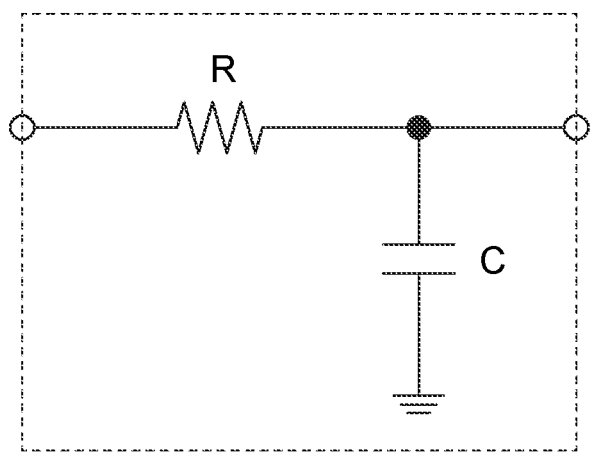
FIG. 11 is a circuit diagram illustrating a configuration example of a delay circuit.

The delay circuit DLY1a being a first delay circuit is provided between the switch circuit SW1 and the control circuit CNT and delays the control signal CTRL1 for a time when the switch circuit SW1 is to be switched from a conduction state to a non-conduction state. The delay circuit DLY1b being a second delay circuit is provided between the switch circuit SW1 and the control circuit CNT and delays the control signal CTRL1 for a time when the switch circuit SW1 is to be switched from the non-conduction state to the conduction state. That is, the delay circuit DLY1a delays a change of the control signal CTRL1, for example, when the control signal CTRL1 falls from a high-level voltage to a low-level voltage and switches the switch circuit SW1 from ON to OFF. The delay circuit DLY1b delays a change of the control signal CTRL1, for example, when the control signal CTRL1 rises from a low-level voltage to a high-level voltage and switches the switch circuit SW1 from OFF to ON. Each of the delay circuits DLY1a and DLY1b can be constituted of, for example, an RC (resistor-capacitor) circuit as illustrated in FIG. 11. The delay time of the delay circuit DLY1a and the delay time of the delay circuit DLY1b may be different from each other. In order to enable the delay times at falling and rising of the control signal CTRL1 to be different from each other, it suffices to switch the RC values of the RC circuits of the delay circuits DLY1a and DLY1b using delay control signals CTRL1a and CTRL1b from the control circuit CNT. The delay control signals CTRL1a and CTRL1b are output from the control circuit CNT to the delay circuits DLY1a and DLY1b, respectively.

A delay circuit DLY2a being a third delay circuit is provided between the switch circuit SW2 and the control circuit CNT and delays the control signal CTRL2 for a time when the switch circuit SW2 is to be switched from a conduction state to a non-conduction state. The delay circuit DLY2b being a fourth delay circuit is provided between the switch circuit SW2 and the control circuit CNT and delays the control signal CTRL2 for a time when the switch circuit SW2 is to be switched from the non-conduction state to the conduction state. That is, the delay circuit DLY2a delays a change of the control signal CTRL2, for example, when the control signal CTRL2 falls from a high-level voltage to a low-level voltage and switches the switch circuit SW2 from ON to OFF. The delay circuit DLY2b delays a change of the control signal CTRL2, for example, when the control signal CTRL2 rises from a low-level voltage to a high-level voltage and switches the switch circuit SW2 from OFF to ON. Each of the delay circuits DLY2a and DLY2b can be constituted of, for example, an RC circuit as illustrated in FIG. 11. The delay time of the delay circuit DLY2a and the delay time of the delay circuit DLY2b may be different from each other. In order to enable the delay times at falling and rising of the control signal CTRL2 to be different from each other, it suffices to switch the RC values of the RC circuits of the delay circuits DLY2a and DLY2b using delay control signals CTRL2a and CTRL2b from the control circuit CNT. The delay control signals CTRL2a and CTRL2b are output from the control circuit CNT to the delay circuits DLY2a and DLY2b, respectively.

A delay circuit DLY3a being a fifth delay circuit is provided between the switch circuit SW3 and the control circuit CNT and delays the control signal CTRL3 for a time when the switch circuit SW3 is to be switched from a conduction state to a non-conduction state. The delay circuit DLY3b being a sixth delay circuit is provided between the switch circuit SW3 and the control circuit CNT and delays the control signal CTRL3 for a time when the switch circuit SW3 is to be switched from the non-conduction state to the conduction state. That is, the delay circuit DLY3a delays a change of the control signal CTRL3, for example, when the control signal CTRL3 falls from a high-level voltage to a low-level voltage and switches the switch circuit SW3 from ON to OFF. The delay circuit DLY3b delays a change of the control signal CTRL3, for example, when the control signal CTRL3 rises from a low-level voltage to a high-level voltage and switches the switch circuit SW3 from OFF to ON. Each of the delay circuits DLY3a and DLY3b can be constituted of, for example, an RC circuit as illustrated in FIG. 11. The delay time of the delay circuit DLY3a and the delay time of the delay circuit DLY3b may be different from each other. In order to enable the delay times at falling and rising of the control signal CTRL3 to be different from each other, it suffices to switch the RC values of the RC circuits of the delay circuits DLY3a and DLY3b using delay control signals CTRL3*a* and CTRL3*b* from the control circuit CNT. The delay control signals CTRL3*a* and CTRL3*b* are output from the control circuit CNT to the delay circuits DLY3*a* and DLY3*b*, respectively.

A delay circuit DLY4*a* being a seventh delay circuit is provided between the switch circuit SW4 and the control circuit CNT and delays the control signal CTRL4 for a time when the switch circuit SW4 is to be switched from a conduction state to a non-conduction state. The delay circuit DLY4*b* being an eighth delay circuit is provided between the switch circuit SW4 and the control circuit CNT and delays the control signal CTRL4 for a time when the switch circuit SW4 is to be switched from the non-conduction state to the conduction state. That is, the delay circuit DLY4*a* delays a change of the control signal CTRL4, for example, when the control signal CTRL4 falls from a high-level voltage to a low-level voltage and switches the switch circuit SW4 from ON to OFF. The delay circuit DLY4*b* delays a change of the control signal CTRL4, for example, when the control signal CTRL4 rises from a low-level voltage to a high-level voltage and switches the switch circuit SW4 from OFF to ON. Each of the delay circuits DLY4*a* and DLY4*b* can be constituted of, for example, an RC circuit as illustrated in FIG. 11. The delay time of the delay circuit DLY4*a* and the delay time of the delay circuit DLY4*b* may be different from each other. In order to enable the delay times at falling and rising of the control signal CTRL4 to be different from each other, it suffices to switch the RC values of the RC circuits of the delay circuits DLY4*a* and DLY4*b* using delay control signals CTRL4*a* and CTRL4*b* from the control circuit CNT. The delay control signals CTRL4*a* and CTRL4*b* are output from the control circuit CNT to the delay circuits DLY4*a* and DLY4*b*, respectively.

Each of the delay circuits DLY1*a* to DLY4*b* can be an RC delay circuit constituted of a resistive element and a capacitive element. For example, FIG. 11 is a circuit diagram illustrating a configuration example of the delay circuits DLY1*a* to DLY4*b*. Each of the delay circuits DLY1*a* to DLY4*b* includes a resistive element R and a capacitive element C. The resistive element R is connected between an input and an output of each of the delay circuits DLY1*a* to DLY4*b*. The capacitive element C is connected between the output of each of the delay circuits DLY1*a* to DLY4*b* and the ground (a reference power source) GND. The time constant of each of the delay circuits DLY1*a* to DLY4*b* can be individually set by setting the resistance value of the resistive element R or the capacitance value of the capacitive element C.

An operation of the semiconductor switch circuit 1 according to the present embodiment is explained next.

Figure 2:
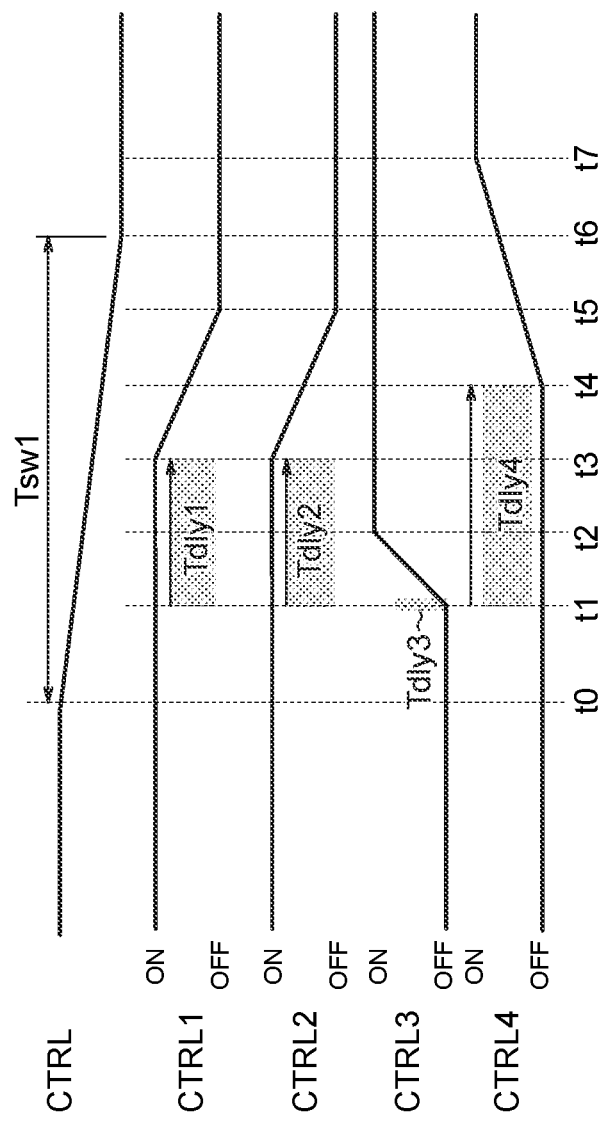
FIG. 2 is a diagram illustrating an example of an operation of the semiconductor switch circuit according to the first embodiment.

FIG. 2 is a timing chart illustrating an example of the operation of the semiconductor switch circuit 1 according to the first embodiment. FIG. 2 illustrates a timing when the semiconductor switch circuit 1 is caused to transition from a conduction state to a non-conduction state. FIGS. 3A to 3D are conceptual diagrams illustrating a manner of transition of the semiconductor switch circuit 1 from a conduction state to a non-conduction state.

(From Conduction State to Non-Conduction State)

As illustrated in FIG. 2, the control signal CTRL is at a high-level voltage when the semiconductor switch circuit 1 is in a conduction state (before t0). Therefore, the control signals CTRL1 and CTRL2 are at a high-level voltage and the switch circuits SW1 and SW2 are in a conduction state (ON). The control signals CTRL3 and CTRL4 are in a non-conduction state (OFF). Accordingly, the semiconductor switch circuit 1 transmits the radio signal from the input terminal RFx to the output terminal RFC and outputs the radio signal from the output terminal RFC.

In the operation illustrated in FIG. 2, the switch circuits SW1 and SW2 are switched from a conduction state to a non-conduction state, and the switch circuits SW3 and SW4 are switched from the non-conduction state to the conduction state.

From t0 to t6, the control signal CTRL falls from the high-level voltage to a low-level voltage. The delay circuits DLY1*a* and DLY2*a* respectively delay the timings of falling of the control signals CTRL1 and CTRL2 for adjustment. The delay circuits DLY3*b* and DLY4*b* respectively delay the timings of rising of the control signals CTRL3 and CTRL4 for adjustment.

Since the switch circuits SW1 and SW2 synchronously operate, delay times Tdly1 and Tdly2 of the falling of the control signals CTRL1 and CTRL2 in the delay circuits DLY1*a* and DLY2*a* are set to be substantially equal to each other. Further, a delay time Tdly3 of the rising of the control signal CTRL3 in the delay circuit DLY3*b* is set to be shorter than the delay times Tdly1 and Tdly2. Furthermore, a delay time Tdly4 of the rising of the control signal CTRL4 in the delay circuit DLY4*b* is set to be longer than the delay times Tdly1 and Tdly2.

Next, at t1, the delay circuit DLY3*b* outputs the rising of the control signal CTRL3 to the switch circuit SW3. Accordingly, the switch circuit SW3 transitions from a non-conduction state to a conduction state (t1 to t2).

Next, at t3, the delay circuits DLY1*a* and DLY2*a* output the falling of the control signals CTL1 and CTRL2 to the switch circuits SW1 and SW2, respectively. Accordingly, the switch circuits SW1 and SW2 transition from a conduction state to a non-conduction state (t3 to t5).

Next, at t4, the delay circuit DLY4*b* outputs the rising of the control signal CTRL4 to the switch circuit SW4. Accordingly, the switch circuit SW4 transitions from a non-conduction state to a conduction state (t4 to t7).

A switching period required for the semiconductor switch circuit 1 to be switched from a conduction state to a non-conduction state is Tsw1 from when the control signal CTRL starts falling at t0 until when the switch circuit SW4 is brought to the conduction state at t6.

Figure 3A:
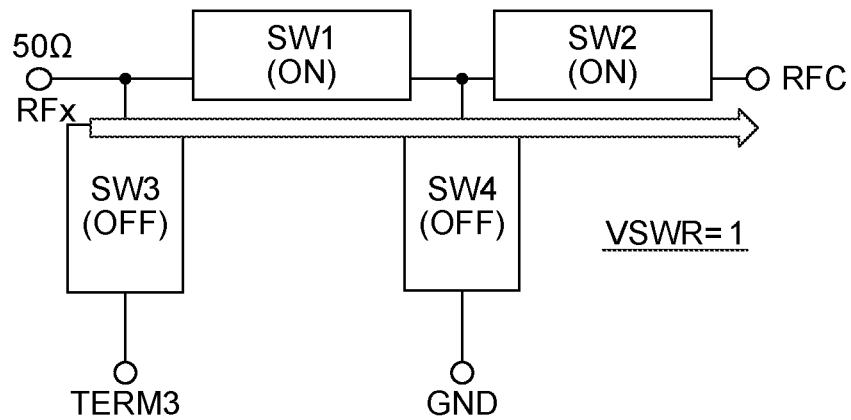
FIG. 3A is a conceptual diagram illustrating a manner of transition of the semiconductor switch circuit from a conduction state to a non-conduction state.

FIGS. 3A to 3D are conceptual diagrams of the semiconductor switch circuit 1, which illustrate transition from a conduction state to a non-conduction state in FIG. 2. First, when the switch circuits SW1 and SW2 are in a conduction state and the switch circuits SW3 and SW4 are in a non-conduction state as illustrated in FIG. 3A, the radio signal passes from the input terminal RFx to the output terminal RFC as indicated by an arrow. The input impedance of the input terminal RFx and the load impedance of the output terminal RFC match and the VSWR is 1.

The VSWR is represented by the following expression 1.

$$\text{VSWR} = (1+\gamma)/(1-\gamma) \qquad \text{(expression 1)}$$

where $\gamma$ is the reflection coefficient and $\gamma = |(Zs-Zout)/(Zs+Zout)|$. Zs is the input impedance at the input terminal RFx or the characteristic impedance of the semiconductor switch circuit 1. Zout is the load impedance in a case where the antenna is viewed from the output terminal RFC. Since Zs=Zout when the impedance matching is maintained, the VSWR is 1 according to the expression 1.

Figure 3B:
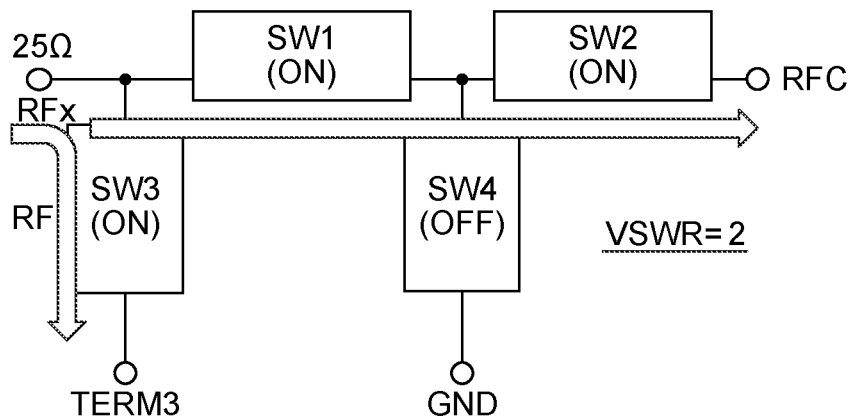
FIG. 3B is another conceptual diagram illustrating a manner of transition of the semiconductor switch circuit from a conduction state to a non-conduction state.

Next, the switch circuit SW3 is brought to a conduction state as illustrated in FIG. 3B. In this case, the radio signal is branched into the path to the output terminal RFC and a path to the termination resistor TERM3. In this case, the characteristic impedance Zs of the semiconductor switch circuit 1 becomes about 25 ohms. Meanwhile, the load impedance Zout is kept at about 50 ohms and therefore the VSWR becomes 2.

Figure 3C:
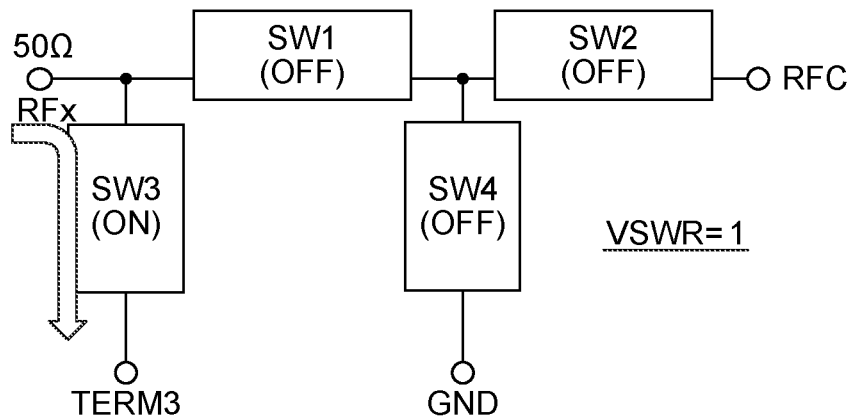
FIG. 3C is another conceptual diagram illustrating a manner of transition of the semiconductor switch circuit from a conduction state to a non-conduction state.

Next, the switch circuits SW1 and SW2 are brought to a non-conduction state as illustrated in FIG. 3C. Accordingly, the radio signal flows to the termination resistor TERM3 via the switch circuit SW3 without flowing to the output terminal RFC. In this case, the impedance of the termination resistor TERM3 is set to about 50 ohms, which is equal to the load impedance. Therefore, the impedance matching is maintained and the VSWR becomes 1.

Figure 3D:
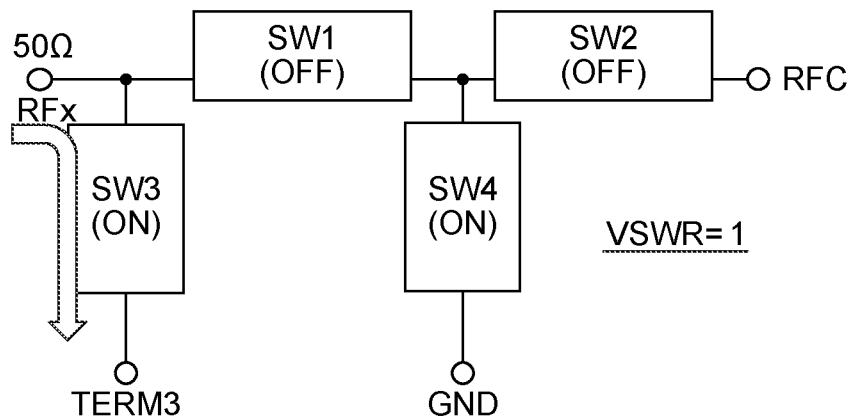
FIG. 3D is another conceptual diagram illustrating a manner of transition of the semiconductor switch circuit from a conduction state to a non-conduction state.

Next, the switch circuit SW4 is brought to a conduction state as illustrated in FIG. 3D. Accordingly, the switch circuit SW4 connects a path between the switch circuits SW1 and SW2 to the ground GND to shunt the path. Therefore, leakage of the radio signal toward the output terminal RFC can be suppressed. Also in this case, the impedance matching is maintained as in FIG. 3C and the VSWR is 1.

(From Non-Conduction State to Conduction State)

Figure 4:
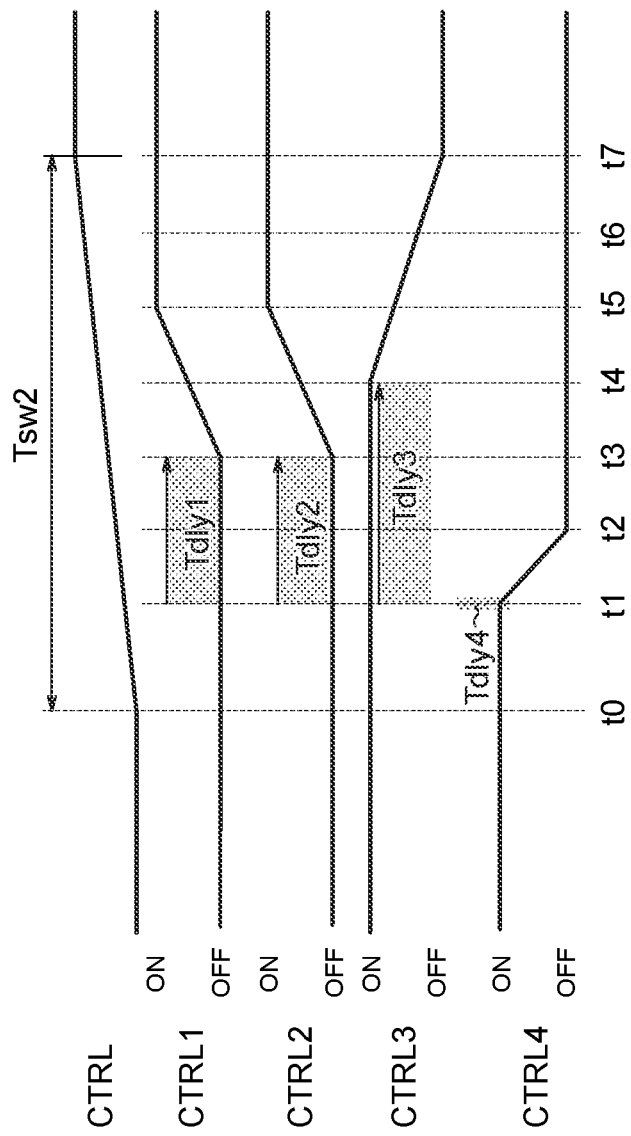
FIG. 4 is a diagram illustrating an example of the operation of the semiconductor switch circuit according to the first embodiment.

FIGS. 4 and 5A to 5D are diagrams illustrating an example of the operation of the semiconductor switch circuit 1 according to the first embodiment. FIG. 4 illustrates a timing when the semiconductor switch circuit 1 is caused to transition from a non-conduction state to a conduction state. FIGS. 5A to 5D are conceptual diagrams illustrating a manner of transition of the semiconductor switch circuit 1 from a non-conduction state to a conduction state.

As illustrated in FIG. 4, the control signal CTRL is at a low-level voltage when the semiconductor switch circuit 1 is in a non-conduction state (before t0). Therefore, the control signals CTRL1 and CTRL2 are at a low-level voltage and the switch circuits SW1 and SW2 are in a non-conduction state (OFF). The control signals CTRL3 and CTRL4 are in a conduction state (ON). Accordingly, the semiconductor switch circuit 1 shunts the radio signal from the input terminal RFx toward the ground GND without outputting the radio signal from the output terminal RFC.

In the operation illustrated in FIG. 4, the switch circuits SW1 and SW2 are switched from a non-conduction state to a conduction state, and the switch circuits SW3 and SW4 are switched from a conduction state to a non-conduction state.

From t0 to t7, the control signal CTRL rises from the low-level voltage to a high-level voltage. The delay circuits DLY1b and DLY2b respectively delay the timings of rising of the control signal CTRL1 and CTRL2 for adjustment. The delay circuits DLY3a and DLY4a respectively delay the timings of falling of the control signals CTRL3 and CTRL4 for adjustment.

Since the switch circuits SW1 and SW2 synchronously operate, delay times Tdly1 and Tdly2 of the rising of the control signals CTRL1 and CTRL2 in the delay circuits DLY1b and DLY2b are set to be substantially equal to each other. Further, a delay time Tdly4 of the falling of the control signal CTRL4 in the delay circuit DLY4a is set to be shorter than the delay times Tdly1 and Tdly2. Furthermore, a delay time Tdly3 of the falling of the control signal CTRL3 in the delay circuit DLY3a is set to be longer than the delay times Tdly1 and Tdly2.

Next, at t1, the delay circuit DLY4a outputs the falling of the control signal CTRL4 to the switch circuit SW4. Accordingly, the switch circuit SW4 transitions from a conduction state to a non-conduction state (t1 to t2).

Next, at t3, the delay circuits DLY1b and DLY2b output the rising of the control signals CTL1 and CTRL2 to the switch circuits SW1 and SW2, respectively. Accordingly, the switch circuits SW1 and SW2 transition from a non-conduction state to a conduction state (t3 to t5).

Next, at t4, the delay circuit DLY3a outputs the falling of the control signal CTRL3 to the switch circuit SW3. Accordingly, the switch circuit SW3 transitions from a conduction state to a non-conduction state (t4 to t7).

A switching period required for the semiconductor switch circuit 1 to be switched from a non-conduction state to a conduction state is Tsw2 from when the control signal CTRL starts rising at t0 until when the switch circuit SW3 is brought to the non-conduction state at t7.

Figure 5A:
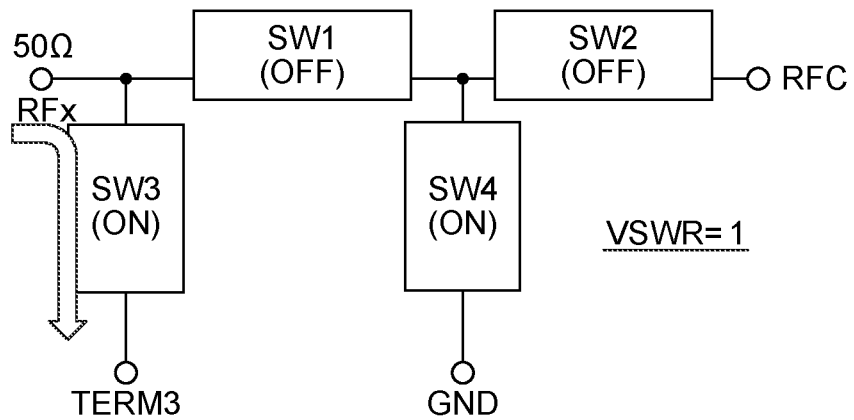
FIG. 5A is a conceptual diagram illustrating a manner of transition of the semiconductor switch circuit from a non-conduction state to a conduction state.

FIGS. 5A to 5D are conceptual diagrams of the semiconductor switch circuit 1, which illustrate transition from a non-conduction state to a conduction state in FIG. 4. First, when the switch circuits SW1 and SW2 are in a non-conduction state and the switch circuits SW3 and SW4 are in a conduction state as illustrated in FIG. 5A, the radio signal shunts from the input terminal RFx to the termination resistor TERM3 as indicated by an arrow. The switch circuit SW4 connects the path between the switch circuits SW1 and SW2 to the ground GND to shunt the path. Therefore, leakage of the radio signal toward the output terminal RFC can be suppressed. The characteristic impedance of the semiconductor switch circuit 1 and the load impedance of the termination resistor TERM3 match and the VSWR is 1.

Figure 5B:
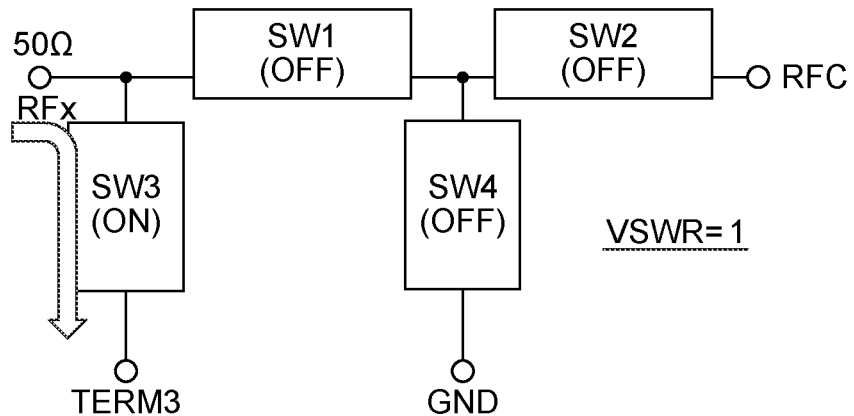
FIG. 5B is another conceptual diagram illustrating a manner of transition of the semiconductor switch circuit from a non-conduction state to a conduction state.

Next, the switch circuit SW4 is brought to a non-conduction state as illustrated in FIG. 5B. At this time, the radio signal flows to the termination resistor TERM3 via the switch circuit SW3. The impedance of the termination resistor TERM3 is set to about 50 ohms, which is equal to the load impedance. Therefore, the impedance matching is maintained and the VSWR is 1.

Figure 5C:
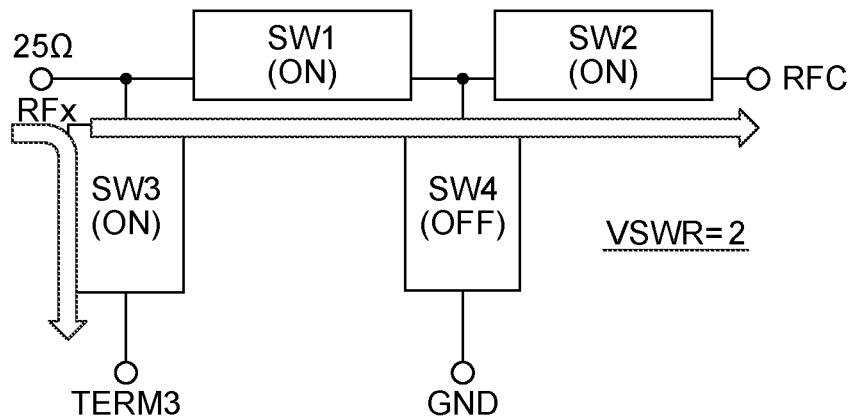
FIG. 5C is another conceptual diagram illustrating a manner of transition of the semiconductor switch circuit from a non-conduction state to a conduction state.

Next, the switch circuits SW1 and SW2 are brought to a conduction state as illustrated in FIG. 5C. In this case, the radio signal is branched into the path to the output terminal RFC and the path to the termination resistor TERM3. In this case, the characteristic impedance Zs of the semiconductor switch circuit 1 becomes about 25 ohms. Meanwhile, the load impedance Zout is kept at about 50 ohms and therefore the VSWR becomes 2. Accordingly, the VSWR is 2.

Figure 5D:
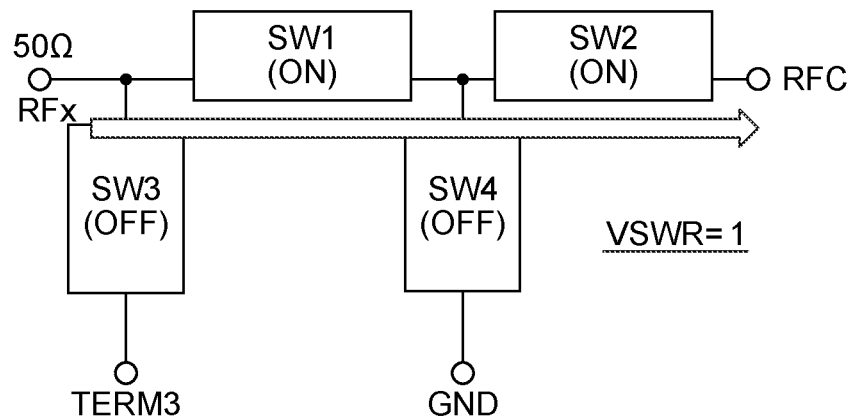
FIG. 5D is another conceptual diagram illustrating a manner of transition of the semiconductor switch circuit from a non-conduction state to a conduction state.

Next, the switch circuit SW3 is brought to a non-conduction state as illustrated in FIG. 5D. Therefore, the radio signal passes from the input terminal RFx to the output terminal RFC via the switch circuits SW1 and SW2. The characteristic impedance of the semiconductor switch circuit 1 and the load impedance of the output terminal RFC match and the VSWR is 1.

As described above, in the semiconductor switch circuit 1 according to the present embodiment, the switch circuit SW3 is in a conduction state at the time of switching of the switch circuits SW1 and SW2 that function as a through switch. Therefore, the termination resistor TERM3 becomes a path that shunts the radio signal during switching of the switch circuits SW1 and SW2. That is, the switch circuit SW3 and the termination resistor TERM3 do not bring the path between the input terminal RFx and the output terminal RFC to a state of an open circuit or a short circuit during switching of the switch circuits SW1 and SW2.

If the path between the input terminal RFx and the output terminal RFC is open-circuited or short-circuited, the VSWR becomes extremely large. As a result, the power efficiency of the radio signal is lowered in the semiconductor switch circuit 1.

In contrast thereto, the path between the input terminal RFx and the output terminal RFC is not brought to a state of an open circuit or a short circuit during switching of the switch circuits SW1 and SW2 in the present embodiment.

Therefore, the VSWR does not become so large during switching of the switch circuits SW1 and SW2 and the power efficiency of the radio signal can be kept high in the semiconductor switch circuit 1.

Second Embodiment

Figure 6:
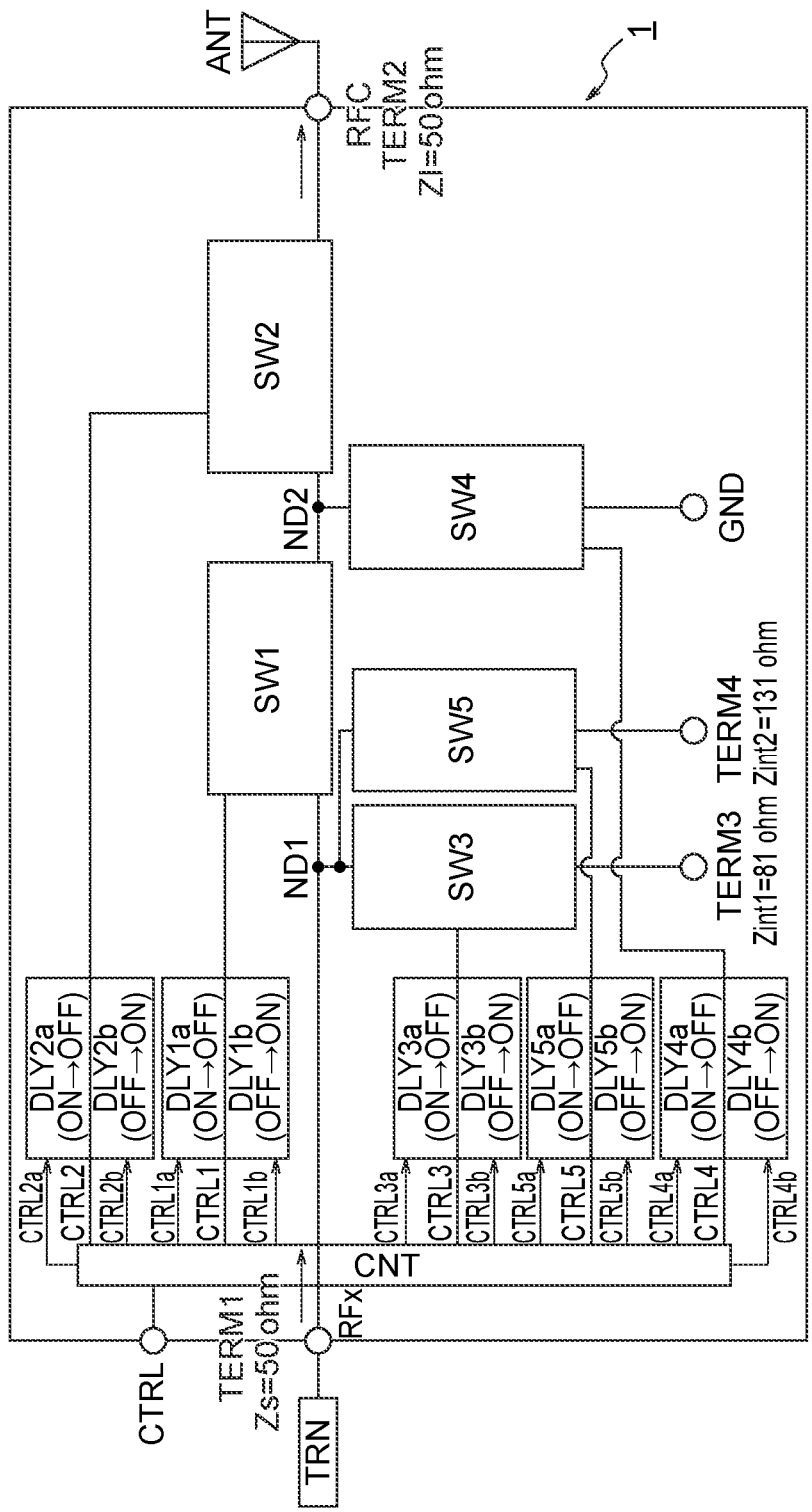
FIG. 6 is a block diagram illustrating a configuration example of a semiconductor switch circuit according to a second embodiment.

FIG. 6 is a block diagram illustrating a configuration example of the semiconductor switch circuit 1 according to a second embodiment. The semiconductor switch circuit 1 according to the second embodiment further includes a switch circuit SW5, a delay circuit DLY5a, and a delay circuit DLY5b.

The switch circuit SW5 is provided between the node ND1 and a termination resistor TERM4 and is connected to the ground GND via the termination resistor TERM4. The termination resistor TERM4 is connected between the switch circuit SW5 and the ground GND. That is, one end of the switch circuit SW5 is connected to the node ND1 and the other end is connected to the ground GND via the termination resistor TERM4. The termination resistor TERM3 is set to, for example, about 81 ohms of impedance as viewed from the switch circuit SW3. The termination resistor TERM4 is set to, for example, about 131 ohms of impedance as viewed from the switch circuit SW5. When the switch circuits SW3 and SW5 are in a conduction state, the termination resistors TERM3 and TERM4 are connected in parallel between the node ND1 and the ground GND. Accordingly, the total impedance of the termination resistors TERM3 and TERM4 becomes about 50 ohms. Therefore, the impedance of the termination resistors TERM3 and TERM4 also matches the characteristic impedance of the semiconductor switch circuit 1.

The switch circuits SW3 and SW5 pass the radio signal from the input terminal RFx to the ground GND via the termination resistors TERM3 and TERM4. That is, the switch circuits SW3 and SW5 respectively function as a so-called "shunt switch". Although not illustrated in the drawings, the switch circuit SW5 is also constituted of one FET or a plurality of FETs similarly to the switch circuit SW3. When the switch circuit SW5 is constituted of plural FETs, the FETs are connected in series or in parallel to each other. The FETs constituting the switch circuit SW5 are controlled by a control signal CTRL5 from the control circuit CNT to be brought to a conduction state/a non-conduction state (ON/OFF) synchronously (simultaneously).

The control circuit CNT receives the control signal CTRL from outside and simultaneously outputs the control signals CTRL1 to CTRL5 corresponding to the control signal CTRL to the delay circuits DLY1a to DLY5b, respectively. That is, the control signals CTRL1 to CTRL5 are simultaneously output from the control circuit CNT to the delay circuits DLY1a to DLY5b, respectively.

The delay circuit DLY5a being a ninth delay circuit is provided between the switch circuit SW5 and the control circuit CNT and delays the control signal CTRL5 for a time when the switch circuit SW5 is to be switched from a conduction state to a non-conduction state. The delay circuit DLY5b being a tenth delay circuit is provided between the switch circuit SW5 and the control circuit CNT and delays the control signal CTRL5 for a time when the switch circuit SW5 is to be switched from a non-conduction state to a conduction state. That is, the delay circuit DLY5a delays a change of the control signal CTRL5, for example, when the control signal CTRL5 falls from a high-level voltage to a low-level voltage and switches the switch circuit SW5 from ON to OFF. The delay circuit DLY5b delays a change of the control signal CTRL5, for example, when the control signal CTRL5 rises from a low-level voltage to a high-level voltage and switches the switch circuit SW5 from OFF to ON. Each of the delay circuits DLY5a and DLY5b can be constituted of, for example, an RC circuit as illustrated in FIG. 11. The delay time of the delay circuit DLY5a and the delay time of the delay circuit DLY5b may be different from each other. In order to enable the delay times at falling and rising of the control signal CTRL5 to be different from each other, it suffices to switch the RC values of the RC circuits of the delay circuits DLY5a and DLY5b using delay control signals CTRL5a and CTRL5b from the control circuit CNT. The delay control signals CTRL5a and CTRL5b are output from the control circuit CNT to the delay circuits DLY5a and DLY5b, respectively.

Each of the delay circuits DLY5a and DLY5b can be an RC delay circuit constituted of a resistive element R and a capacitive element C as illustrated in FIG. 11. The resistive element R is connected between the control circuit CNT and a switch circuit (any of SW1 to SW4). The capacitive element C is connected between a node between the resistive element R and the switch circuit (any of SW1 to SW4), and the ground. The time constant of each of the delay circuits DLY5a and DLY5b can be individually set by setting the resistance value of the resistive element R or the capacitance value of the capacitive element C.

An operation of the semiconductor switch circuit 1 according to the second embodiment is explained next.

Figure 7:
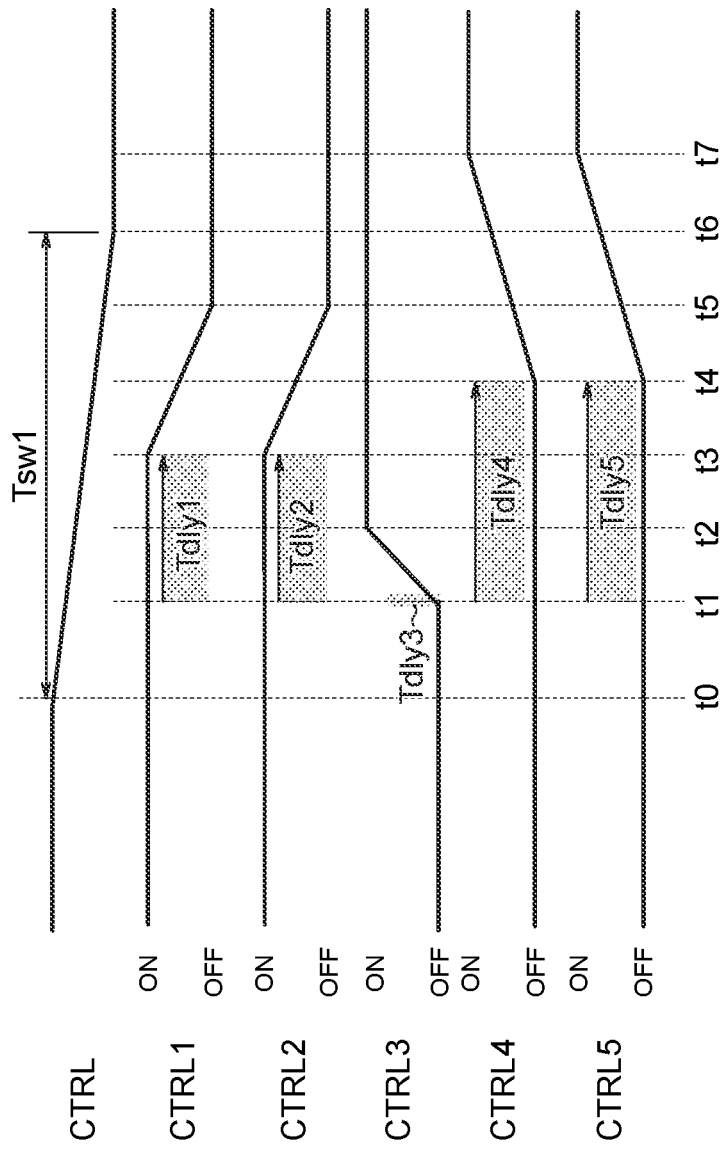
FIG. 7 is a diagram illustrating an example of an operation of the semiconductor switch circuit according to the second embodiment.

FIGS. 7 and 8A to 8D are diagrams illustrating an example of an operation of the semiconductor switch circuit 1 according to the second embodiment. FIG. 7 illustrates a timing when the semiconductor switch circuit 1 is caused to transition from a conduction state to a non-conduction state. FIGS. 8A to 8D are conceptual diagrams illustrating a manner of transition of the semiconductor switch circuit 1 from a conduction state to a non-conduction state.

(From Conduction State to Non-Conduction State)

As illustrated in FIG. 7, the control signals CTRL and CTRL1 to CLRL4 operate in the same manner as the operations thereof illustrated in FIG. 2. Therefore, the switch circuits SW1 to SW4 and the delay circuits DLY1a to DLY4b operate similarly in the first embodiment. In the operation illustrated in FIG. 7, the switch circuits SW1 and SW2 are switched from a conduction state to a non-conduction state and the switch circuits SW3 to SW5 are switched from a non-conduction state to a conduction state.

In this example, a delay time Tdly5 of rising of the control signal CTRL5 in the delay circuit DLY5b is set to be longer than all of the delay times Tdly1, Tdly2, and Tdly3 similarly in the delay circuit DLY4b. It is possible to configure that the control signal CTRL5 rises at t4 substantially synchronously with the control signal CTRL4. However, the delay time Tdly5 may be somewhat longer or shorter than the delay time Tdly4.

Therefore, the switch circuit SW5 transitions from a non-conduction state to a conduction state (between t4 and t7) after the switch circuit SW3 is brought to a conduction state and the switch circuits SW1 and SW2 start being brought to a non-conduction state. For example, the delay circuit DLY3b outputs the control signal CTRL3 to the switch circuit SW3 for causing the switch circuit SW3 to be brought to the conduction state. Subsequently, the delay circuits DLY1a and DLY2a output the control signals CTRL1 and CTRL2 to the switch circuits SW1 and SW2 for causing the switch circuits SW1 and SW2 to be brought to the non-conduction state, respectively. Further subsequently, the delay circuits DLY4b and DLY5b output the control signals CTRL4 and CTRL5 to the switch circuits SW4 and SW5 for causing the switch circuits SW4 and SW5 to be brought to the conduction state, respectively.

A switching period required for the semiconductor switch circuit 1 to be switched from a conduction state to a non-conduction state is Tsw1 from when the control signal CTRL falls at t0 until when the switch circuits SW4 and SW5 are brought to the conduction state at t7.

Figure 8A:
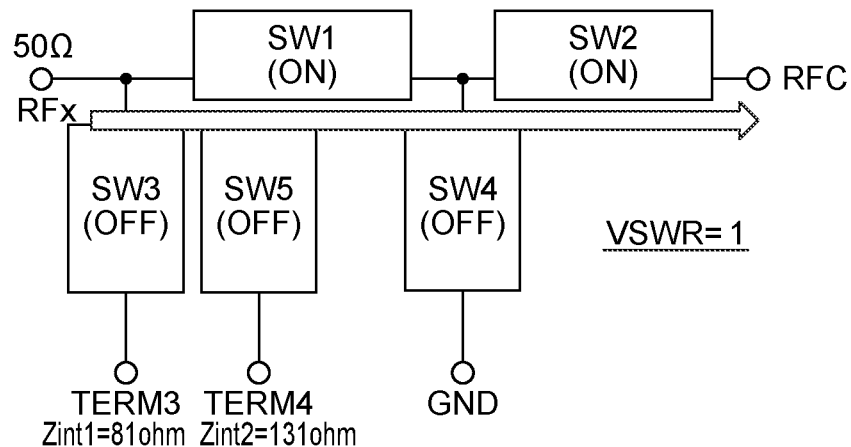
FIG. 8A is a conceptual diagram illustrating a manner of transition of the semiconductor switch circuit from a conduction state to a non-conduction state.

FIGS. 8A to 8D are conceptual diagrams of the semiconductor switch circuit 1, which illustrate transition from a conduction state to a non-conduction state in FIG. 7. First, when the switch circuits SW1 and SW2 are in a conduction state and the switch circuits SW3 to SW5 are in a non-conduction state as illustrated in FIG. 8A, the radio signal passes from the input terminal RFx to the output terminal RFC as indicated by an arrow. The characteristic impedance of the semiconductor switch circuit 1 and the load impedance of the output terminal RFC match and the VSWR is 1.

Figure 8B:
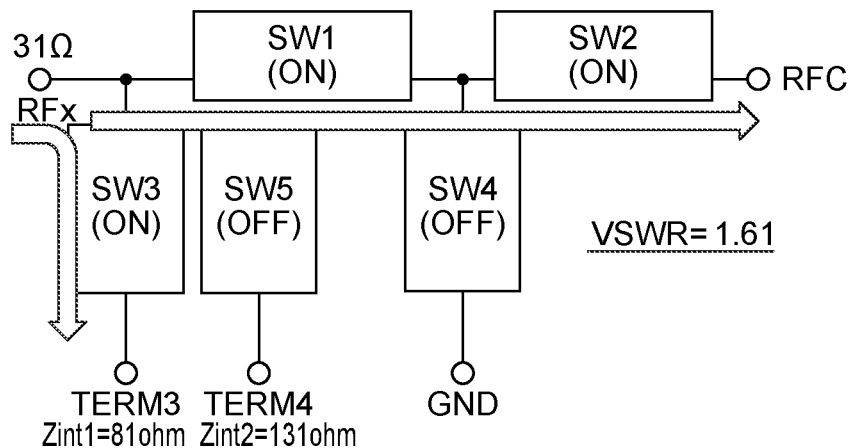
FIG. 8B is another conceptual diagram illustrating a manner of transition of the semiconductor switch circuit from a conduction state to a non-conduction state.

Next, the switch circuit SW3 is brought to a conduction state as illustrated in FIG. 8B. In this case, the radio signal is branched into the path to the output terminal RFC and the path to the termination resistor TERM3. The impedance of the path to the output terminal RFC is, for example, about 50 ohms and the impedance of the termination resistor TERM3 is set to, for example, about 81 ohms. Therefore, the characteristic impedance Zs at the input terminal RFx is about 31 ohms. Meanwhile, the load impedance Zout is kept at about 50 ohms and thus the VSWR becomes about 1.61.

Figure 8C:
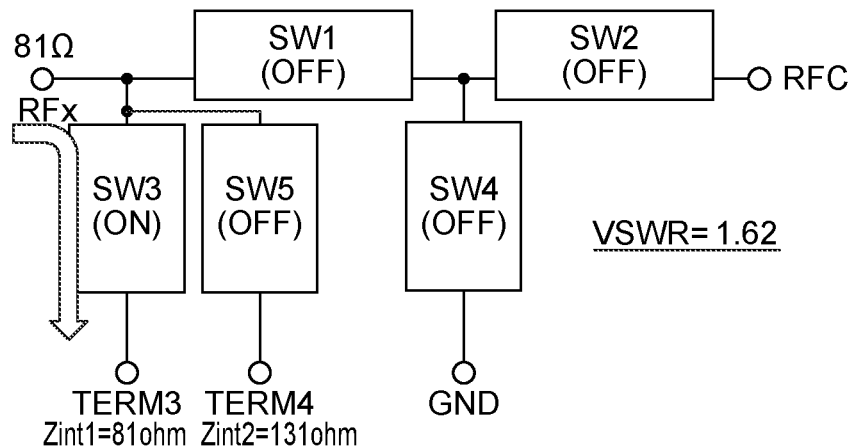
FIG. 8C is another conceptual diagram illustrating a manner of transition of the semiconductor switch circuit from a conduction state to a non-conduction state.

Next, the switch circuits SW1 and SW2 are brought to a non-conduction state as illustrated in FIG. 8C. Accordingly, the radio signal flows to the termination resistor TERM3 via the switch circuit SW3. In this case, the impedance of the termination resistor TERM3 is set to about 81 ohms. Therefore, the VSWR becomes about 1.62.

Figure 8D:
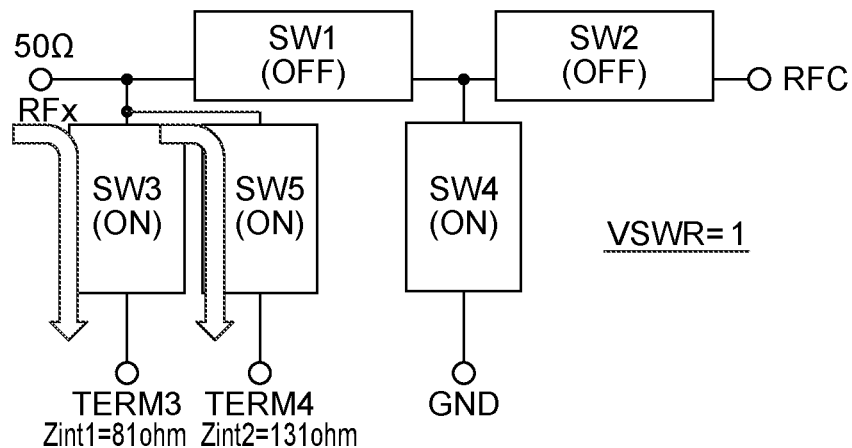
FIG. 8D is another conceptual diagram illustrating a manner of transition of the semiconductor switch circuit from a conduction state to a non-conduction state.

Next, the switch circuits SW4 and SW5 are brought to a conduction state as illustrated in FIG. 8D. Accordingly, the switch circuit SW4 connects the path between the switch circuits SW1 and SW2 to the ground GND to shunt the path. The switch circuit SW5 connects the path between the input terminal RFx and the switch circuits SW1 to the ground GND via the termination resistor TERM4 to shunt the path. In this case, the radio signal flows to the termination resistors TERM3 and TERM4 via the switch circuits SW3 and SW5, respectively. The impedance of the termination resistor TERM3 is set to, for example, about 81 ohms and the impedance of the termination resistor TERM4 is set to, for example, about 131 ohms. Since the termination resistors TERM3 and TERM4 are connected in parallel, the characteristic impedance at the input terminal RFx becomes about 50 ohms. Meanwhile, the load impedance Zout is kept at about 50 ohms and therefore the VSWR is 1.

(From Non-Conduction State to Conduction State)

Figure 9:
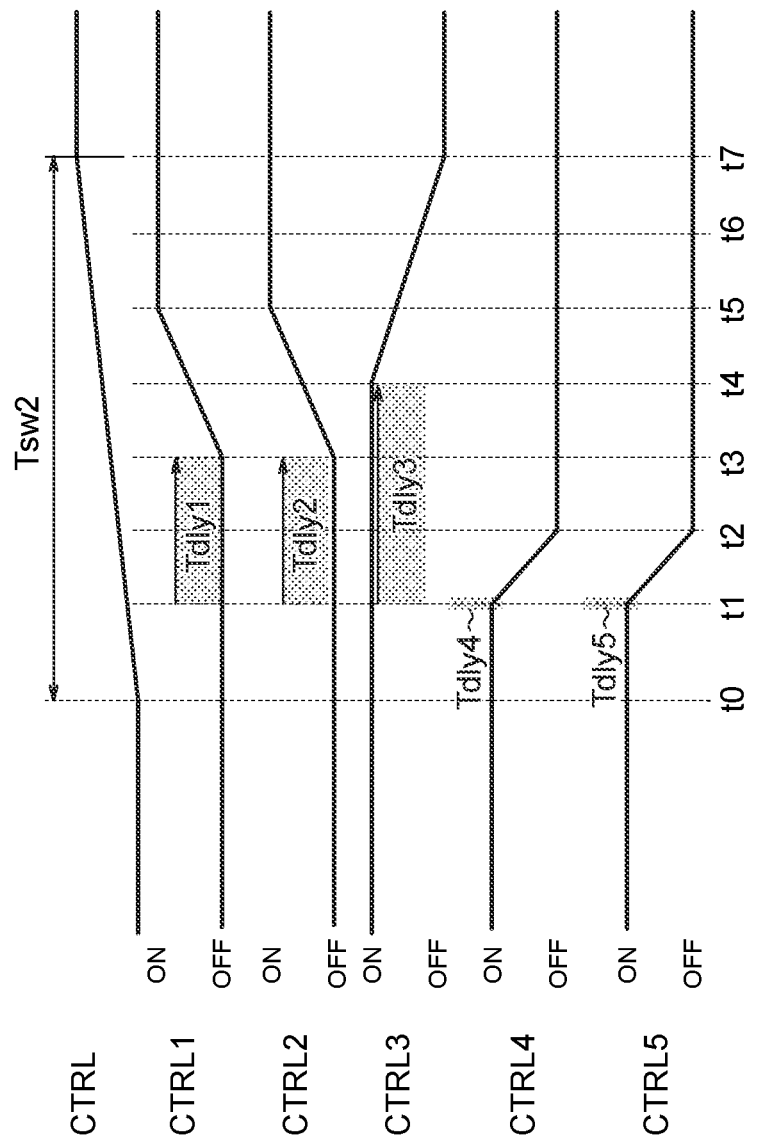
FIG. 9 is a diagram illustrating an example of an operation of the semiconductor switch circuit according to the second embodiment.

FIGS. 9 and 10A to 10D are diagrams illustrating an example of the operation of the semiconductor switch circuit 1 according to the second embodiment. FIG. 9 illustrates a timing when the semiconductor switch circuit 1 is caused to transition from a non-conduction state to a conduction state. FIGS. 10A to 10D are conceptual diagrams illustrating a manner of transition of the semiconductor switch circuit 1 from a non-conduction state to a conduction state.

As illustrated in FIG. 9, the control signals CTRL and CTRL1 to CLRL4 operate in the same manner as the operations thereof illustrated in FIG. 4. Therefore, the switch circuits SW1 to SW4 and the delay circuits DLY1a to DLY4b operate similarly in the first embodiment. In the operation illustrated in FIG. 9, the switch circuits SW1 and SW2 are switched from a non-conduction state to a conduction state and the switch circuits SW3, SW4, and SW5 are switched from a conduction state to a non-conduction state.

In this example, a delay time Tdly5 of falling of the control signal CTRL5 in the delay circuit DLY5a is set to be shorter than all of the delay times Tdly1, Tdly2, and Tdly3 similarly in the delay circuit DLY4a. It is possible to configure that the control signal CTRL5 falls at t1 substantially synchronously with the control signal CTRL4. However, the delay time Tdly5 may be somewhat longer or shorter than the delay time Tdly4.

Therefore, the switch circuit SW5 transitions from a conduction state to a non-conduction state (between t1 and t2) before the switch circuit SW3 is brought to a non-conduction state and the switch circuits SW1 and SW2 are brought to a conduction state. For example, the delay circuits DLY4a and DLY5a output the control signals CTRL4 and CTRL5 to the switch circuits SW4 and SW5 for causing the switch circuits SW4 and SW5 to be brought to the non-conduction state, respectively. Subsequently, the delay circuits DLY1b and DLY2b output the control signals CTRL1 and CTRL2 to the switch circuits SW1 and SW2 for causing the switch circuits SW1 and SW2 to be brought to the conduction state, respectively. Further subsequently, the delay circuit DLY3a outputs the control signal CTRL3 to the switch circuit SW3 for causing the switch circuit SW3 to be brought to the non-conduction state.

A switching period required for the semiconductor switch circuit 1 to be switched from a non-conduction state to a conduction state is Tsw2 from when the control signal CTRL rises at t0 until when the switch circuit SW3 is brought to the non-conduction state at t7.

Figure 10A:
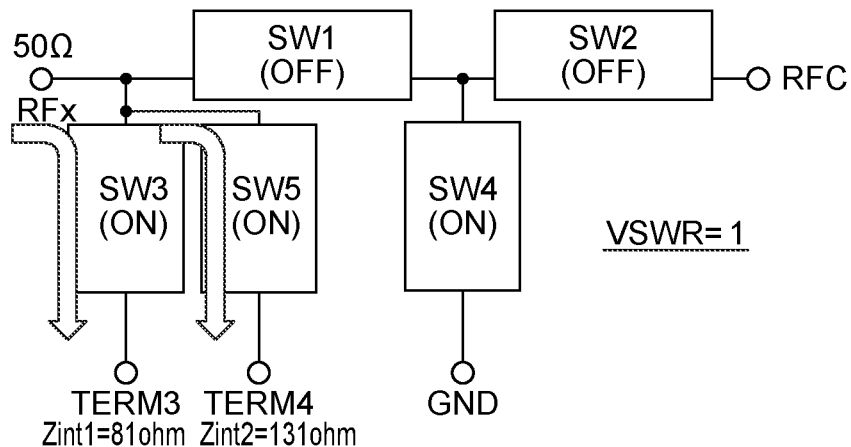
FIG. 10A is a conceptual diagram illustrating a manner of transition of the semiconductor switch circuit from a non-conduction state to a conduction state.

FIGS. 10A to 10D are conceptual diagrams of the semiconductor switch circuit 1, which illustrate transition from a non-conduction state to a conduction state in FIG. 9. First, when the switch circuits SW1 and SW2 are in a non-conduction state and the switch circuits SW3 to SW5 are in a conduction state as illustrated in FIG. 10A, the radio signal is shunted to the ground GND from the input terminal RFx via the switch circuits SW3 and SW5 and the termination resistors TERM3 and TERM4 as indicated by arrows. The termination resistors TERM3 and TERM4 are connected in parallel to each other and have, for example, about 81 ohms and about 131 ohms (about 50 ohms in total), respectively. Accordingly, the characteristic impedance of the input terminal RFx and the load impedance of the output terminal RFC match and the VSWR is 1.

Figure 10B:
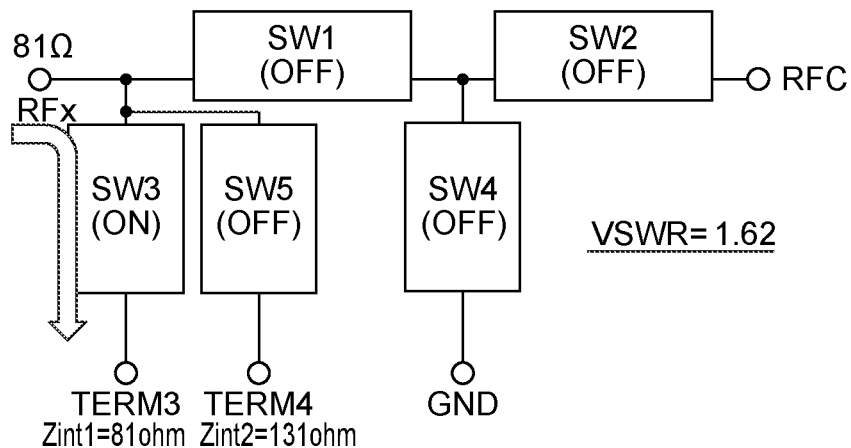
FIG. 10C is another conceptual diagram illustrating a manner of transition of the semiconductor switch circuit from a non-conduction state to a conduction state.
FIG. 10D is another conceptual diagram illustrating a manner of transition of the semiconductor switch circuit from a non-conduction state to a conduction state.

Next, the switch circuits SW4 and SW5 are brought to a non-conduction state as illustrated in FIG. 10B. Therefore, the radio signal flows to the termination resistor TERM3 via the switch circuit SW3. In this case, the impedance of the termination resistor TERM3 is set to, for example, about 81 ohms. Therefore, the VSWR becomes about 1.62.

Figure 10C:
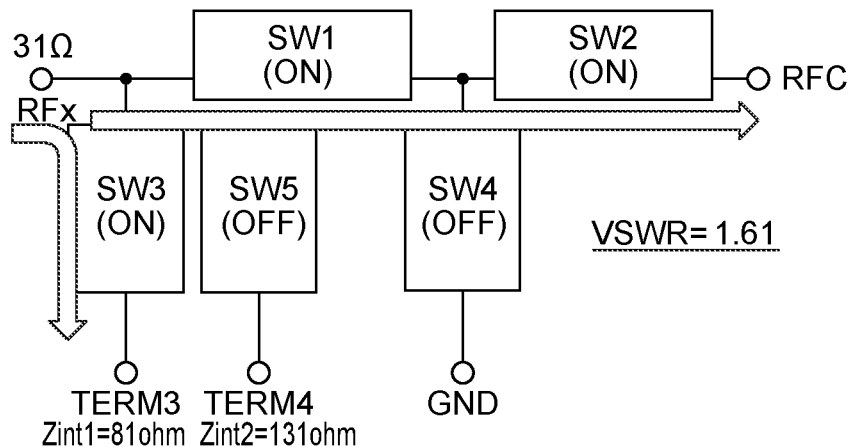

Next, the switch circuits SW1 and SW2 are brought to a conduction state as illustrated in FIG. 10C. In this case, the radio signal is branched into the path to the output terminal RFC and the path to the termination resistor TERM3. The impedance of the path to the output terminal RFC is, for example, about 50 ohms and the impedance of the termination resistor TERM3 is set to, for example, about 81 ohms. Therefore, the impedance Zs at the input terminal RFx is about 31 ohms. Meanwhile, the load impedance Zout is kept at about 50 ohms and accordingly the VSWR becomes about 1.61.

Figure 10D:
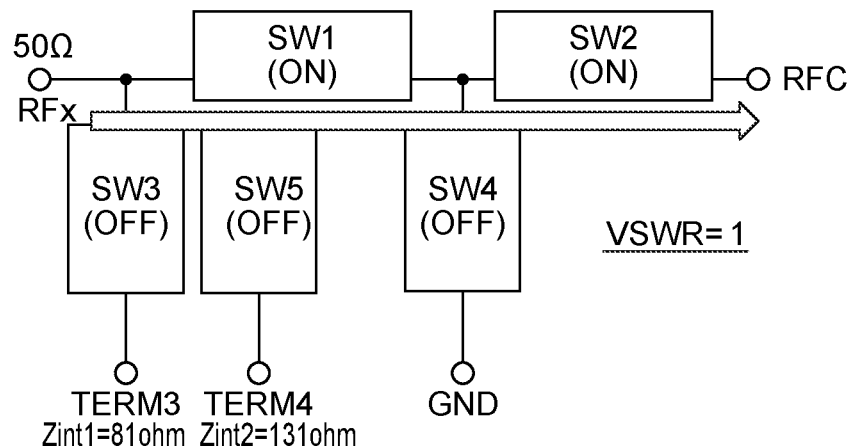

Next, the switch circuits SW1 and SW2 are brought to a conduction state and the switch circuit SW3 is brought to a non-conduction state as illustrated in FIG. 10D. Accordingly, the switch circuits SW1 and SW2 are in a conduction state and the switch circuits SW3 to SW5 are in a non-conduction state. In this case, the radio signal passes from the input terminal RFx to the output terminal RFC. The characteristic impedance of the input terminal RFx and the load impedance of the output terminal RFC match and the VSWR is 1.

As described above, according to the second embodiment, the termination resistor provided on the shunt side is divided into the termination resistors TERM3 and TERM4 connected in parallel to each other. The termination resistor TERM3 is connected to the node ND1 via the switch circuit SW3 and the termination resistor TERM4 is connected to the node ND1 via the switch circuit SW5. The delay circuit DLY5a is provided between the switch circuit SW5 and the control circuit CNT and delays the control signal CTRL5 for switching the switch circuit SW5 from a conduction state to a non-conduction state. The delay circuit DLY5b is provided between the switch circuit SW5 and the control circuit CNT and delays the control signal CTRL5 for switching the switch circuit SW5 from a non-conduction state to a conduction state.

Accordingly, the switch circuit SW3 is in a conduction state during switching of the switch circuits SW1 and SW2 that function as a through switch. Therefore, the termination resistor TERM3 serves as a path that shunts the radio signal during switching of the switch circuits SW1 and SW2. That is, the switch circuit SW3 and the termination resistor TERM3 do not bring the path between the input terminal RFx and the output terminal RFC into a state of an open circuit or a short circuit during switching of the switch circuits SW1 and SW2. When the switch circuits SW1 and SW2 are in a non-conduction state, the switch circuits SW3 to SW5 are in a conduction state and the termination resistors TERM3 and TERM4 become paths that shunt the radio signal.

The termination resistor is divided into the termination resistors TERM3 and TERM4. Connection of these termination resistors TERM3 and TERM4 in parallel to each other provides as a whole a substantially equal impedance to that of the characteristic impedance (for example, about 50 ohms) of the semiconductor switch circuit 1. Accordingly, the VSWR can be suppressed to 1.62 or 1.61, which is lower than 2, by shunting of the radio signal with one termination resistor TERM3 during switching of the switch circuits SW1 and SW2. That is, the VSWR can be further reduced according to the second embodiment. As a result, the power efficiency of the radio signal in the semiconductor switch circuit 1 can be kept high.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor device comprising:
a first terminal configured to receive a high-frequency signal;
a second terminal configured to output the high-frequency signal;
first and second switch circuits connected in series between the first terminal and the second terminal;
a third switch circuit provided between a first node between the first terminal and the first switch circuit, and a first resistive element, and connected to a reference power source via the first resistive element;
a fourth switch circuit connected between a second node between the first switch circuit and the second switch circuit, and the reference power source;
a control circuit configured to switch the first to fourth switch circuits between a conduction state and a non-conduction state;
a first delay circuit provided between the first switch circuit and the control circuit, the first delay circuit being configured to delay a first control signal transmitted from the control circuit to the first switch circuit, when the first control signal switches the first switch circuit from a conduction state to a non-conduction state;
a second delay circuit provided between the first switch circuit and the control circuit, the second delay circuit being configured to delay the first control signal, when the first control signal switches the first switch circuit from a non-conduction state to a conduction state;
a third delay circuit provided between the second switch circuit and the control circuit, the third delay circuit being configured to delay a second control signal transmitted from the control circuit to the second switch circuit, when the second control signal switches the second switch circuit from a conduction state to a non-conduction state;
a fourth delay circuit provided between the second switch circuit and the control circuit, the fourth delay circuit being configured to delay the second control signal, when the second control signal switches the second switch circuit from a non-conduction state to a conduction state;
a fifth delay circuit provided between the third switch circuit and the control circuit, the fifth delay circuit being configured to delay a third control signal transmitted from the control circuit to the third switch circuit, when the third control signal switches the third switch circuit from a conduction state to a non-conduction state;
a sixth delay circuit provided between the third switch circuit and the control circuit, the sixth delay circuit being configured to delay the third control signal, when the third control signal switches the third switch circuit from a non-conduction state to a conduction state;
a seventh delay circuit provided between the fourth switch circuit and the control circuit, the seventh delay circuit being configured to delay a fourth control signal transmitted from the control circuit to the fourth switch circuit, when the fourth control signal switches the fourth switch circuit from a conduction state to a non-conduction state; and
an eighth delay circuit provided between the fourth switch circuit and the control circuit, the eighth delay circuit being configured to delay the fourth control signal, when the fourth control signal switches the fourth switch circuit from a non-conduction state to a conduction state, wherein
the sixth delay circuit outputs the third control signal to the third switch circuit,
the first and third delay circuits subsequently output the first control signal and the second control signal to the first and second switch circuits, respectively, and the eighth delay circuit further subsequently outputs the fourth control signal to the fourth switch circuit, when the first and second switch circuits are switched from a conduction state to a non-conduction state, and the third and fourth switch circuits are switched from a non-conduction state to a conduction state.

2. The device of claim 1, wherein each of the first to fourth switch circuits is constituted of one FET (Field Effect Transistor) or a plurality of FETs.

3. The device of claim 1, wherein each of the first to eighth delay circuits is constituted of an RC (Resistor Capacitor) circuit.

4. The device of claim 3, wherein each of the RC circuits comprises a resistive element connected between the control circuit and an associated one of the first to fourth switch circuits, and a capacitive element connected between a node between the resistive element and the associated one of the first to fourth switch circuits and ground.

5. The device of claim 1, wherein the first to fourth switch circuits, the first to eighth delay circuits, and the control circuit are provided on one semiconductor chip.

6. A semiconductor device comprising:
a first terminal configured to receive a high-frequency signal;
a second terminal configured to output the high-frequency signal;
first and second switch circuits connected in series between the first terminal and the second terminal;
a third switch circuit provided between a first node between the first terminal and the first switch circuit, and a first resistive element, and connected to a reference power source via the first resistive element;
a fourth switch circuit connected between a second node between the first switch circuit and the second switch circuit, and the reference power source;
a control circuit configured to switch the first to fourth switch circuits between a conduction state and a non-conduction state;
a first delay circuit provided between the first switch circuit and the control circuit, the first delay circuit being configured to delay a first control signal transmitted from the control circuit to the first switch circuit, when the first control signal switches the first switch circuit from a conduction state to a non-conduction state;
a second delay circuit provided between the first switch circuit and the control circuit, the second delay circuit being configured to delay the first control signal, when the first control signal switches the first switch circuit from a non-conduction state to a conduction state;
a third delay circuit provided between the second switch circuit and the control circuit, the third delay circuit being configured to delay a second control signal transmitted from the control circuit to the second switch circuit, when the second control signal switches the second switch circuit from a conduction state to a non-conduction state;
a fourth delay circuit provided between the second switch circuit and the control circuit, the fourth delay circuit being configured to delay the second control signal, when the second control signal switches the second switch circuit from a non-conduction state to a conduction state;
a fifth delay circuit provided between the third switch circuit and the control circuit, the fifth delay circuit being configured to delay a third control signal transmitted from the control circuit to the third switch circuit, when the third control signal switches the third switch circuit from a conduction state to a non-conduction state;
a sixth delay circuit provided between the third switch circuit and the control circuit, the sixth delay circuit being configured to delay the third control signal, when the third control signal switches the third switch circuit from a non-conduction state to a conduction state;
a seventh delay circuit provided between the fourth switch circuit and the control circuit, the seventh delay circuit being configured to delay a fourth control signal transmitted from the control circuit to the fourth switch circuit, when the fourth control signal switches the fourth switch circuit from a conduction state to a non-conduction state; and
an eighth delay circuit provided between the fourth switch circuit and the control circuit, the eighth delay circuit being configured to delay the fourth control signal, when the fourth control signal switches the fourth switch circuit from a non-conduction state to a conduction state, wherein
the seventh delay circuit outputs the fourth control signal to the fourth switch circuit,
the second and fourth delay circuits subsequently output the first control signal and the second control signal to the first and second switch circuits, respectively, and
the fifth delay circuit further subsequently outputs the third control signal to the third switch circuit,
when the first and second switch circuits are switched from a non-conduction state to a conduction state, and the third and fourth switch circuits are switched from a conduction state to a non-conduction state.

7. The device of claim 1, wherein
the seventh delay circuit outputs the fourth control signal to the fourth switch circuit,
the second and fourth delay circuits subsequently output the first control signal and the second control signal to the first and second switch circuits, respectively, and
the fifth delay circuit further subsequently outputs the third control signal to the third switch circuit,
when the first and second switch circuits are switched from a non-conduction state to a conduction state, and the third and fourth switch circuits are switched from a conduction state to a non-conduction state.

8. The device of claim 1, wherein
a delay time of the first control signal in the first delay circuit is substantially equal to a delay time of the second control signal in the third delay circuit, and
a delay time of the first control signal in the second delay circuit is substantially equal to a delay time of the second control signal in the fourth delay circuit.

9. The device of claim 1, wherein
the first to fourth control signals are simultaneously output from the control circuit,
a delay time of the third control signal in the sixth delay circuit is shorter than respective delay times of the first and second control signals in the first and third delay circuits, and
a delay time of the fourth control signal in the eighth delay circuit is longer than the delay times of the first and second control signals in the first and third delay circuits.

10. The device of claim 1, wherein
the first to fourth control signals are simultaneously output from the control circuit, a delay time of the fourth control signal in the seventh delay circuit is shorter than respective delay times of the first and second control signals in the second and fourth delay circuits, and a delay time of the third control signal in the fifth delay circuit is longer than the delay times of the first and second control signals in the second and fourth delay circuits.

11. A semiconductor device comprising:
a first terminal configured to receive a high-frequency signal;
a second terminal configured to output the high-frequency signal;
first and second switch circuits connected in series between the first terminal and the second terminal;
a third switch circuit provided between a first node between the first terminal and the first switch circuit, and a first resistive element, and connected to a reference power source via the first resistive element;
a fourth switch circuit connected between a second node between the first switch circuit and the second switch circuit, and the reference power source;
a control circuit configured to switch the first to fourth switch circuits between a conduction state and a non-conduction state;
a first delay circuit provided between the first switch circuit and the control circuit, the first delay circuit being configured to delay a first control signal transmitted from the control circuit to the first switch circuit, when the first control signal switches the first switch circuit from a conduction state to a non-conduction state;
a second delay circuit provided between the first switch circuit and the control circuit, the second delay circuit being configured to delay the first control signal, when the first control signal switches the first switch circuit from a non-conduction state to a conduction state;
a third delay circuit provided between the second switch circuit and the control circuit, the third delay circuit being configured to delay a second control signal transmitted from the control circuit to the second switch circuit, when the second control signal switches the second switch circuit from a conduction state to a non-conduction state;
a fourth delay circuit provided between the second switch circuit and the control circuit, the fourth delay circuit being configured to delay the second control signal, when the second control signal switches the second switch circuit from a non-conduction state to a conduction state;
a fifth delay circuit provided between the third switch circuit and the control circuit, the fifth delay circuit being configured to delay a third control signal transmitted from the control circuit to the third switch circuit, when the third control signal switches the third switch circuit from a conduction state to a non-conduction state;
a sixth delay circuit provided between the third switch circuit and the control circuit, the sixth delay circuit being configured to delay the third control signal, when the third control signal switches the third switch circuit from a non-conduction state to a conduction state;
a seventh delay circuit provided between the fourth switch circuit and the control circuit, the seventh delay circuit being configured to delay a fourth control signal transmitted from the control circuit to the fourth switch circuit, when the fourth control signal switches the fourth switch circuit from a conduction state to a non-conduction state;
an eighth delay circuit provided between the fourth switch circuit and the control circuit, the eighth delay circuit being configured to delay the fourth control signal, when the fourth control signal switches the fourth switch circuit from a non-conduction state to a conduction state;
a fifth switch circuit provided between the first node and a second resistive element and connected to the reference power source via the second resistive element;
a ninth delay circuit provided between the fifth switch circuit and the control circuit, the ninth delay circuit being configured to delay a fifth control signal transmitted from the control circuit to the fifth switch circuit, when the fifth control signal switches the fifth switch circuit from a conduction state to a non-conduction state; and
a tenth delay circuit provided between the fifth switch circuit and the control circuit, the tenth delay circuit being configured to delay the fifth control signal, when the fifth control signal switches the fifth switch circuit from a non-conduction state to a conduction state.

12. The device of claim 11, wherein
the sixth delay circuit outputs the third control signal to the third switch circuit,
the first and third delay circuits subsequently output the first control signal and the second control signal to the first and second switch circuits, respectively, and
the eighth and tenth delay circuits further subsequently output the fourth control signal and the fifth control signal to the fourth and fifth switch circuits, respectively,
when the first and second switch circuits are switched from a conduction state to a non-conduction state, and the third to fifth switch circuits are switched from a non-conduction state to a conduction state.

13. The device of claim 11, wherein
the seventh and ninth delay circuits output the fourth control signal and the fifth control signal to the fourth and fifth switch circuits, respectively,
the second and fourth delay circuits subsequently output the first control signal and the second control signal to the first and second switch circuits, respectively, and
the fifth delay circuit further subsequently outputs the third control signal to the third switch circuit,
when the first and second switch circuits are switched from a non-conduction state to a conduction state, and the third to fifth switch circuits are switched from a conduction state to a non-conduction state.

14. The device of claim 12, wherein
the seventh and ninth delay circuits output the fourth control signal and the fifth control signal to the fourth and fifth switch circuits, respectively,
the second and fourth delay circuits subsequently output the first control signal and the second control signal to the first and second switch circuits, respectively, and
the fifth delay circuit further subsequently outputs the third control signal to the third switch circuit,
when the first and second switch circuits are switched from a non-conduction state to a conduction state, and the third to fifth switch circuits are switched from a conduction state to a non-conduction state.

15. The device of claim 11, wherein
the first to fifth control signals are simultaneously output from the control circuit, a delay time of the third control signal in the sixth delay circuit is shorter than respective delay times of the first and second control signals in the first and third delay circuits, and respective delay times of the fourth and fifth control signals in the eighth and tenth delay circuits are longer than the delay times of the first and second control signals in the first and third delay circuits.

16. The device of claim 11, wherein the first to fifth control signals are simultaneously output from the control circuit, respective delay times of the fourth and fifth control signals in the seventh and ninth delay circuits are shorter than respective delay times of the first and second control signals in the second and fourth control delay circuits, and a delay time of the third control signal in the fifth delay circuit is longer than the delay times of the first and second control signals in the second and fourth delay circuits.

* * * * *